(12) United States Patent
Sanada et al.

(10) Patent No.: US 7,926,439 B2
(45) Date of Patent: Apr. 19, 2011

(54) SUBSTRATE PROCESSING APPARATUS

(75) Inventors: Masakazu Sanada, Kyoto (JP); Osamu Tamada, Kyoto (JP)

(73) Assignee: Dainippon Screen Mfg Co., Ltd. (JP)

( * ) Notice: Subject to any disclaimer, the term of this patent is extended or adjusted under 35 U.S.C. 154(b) by 561 days.

(21) Appl. No.: 11/828,514

(22) Filed: Jul. 26, 2007

(65) Prior Publication Data

US 2008/0022928 A1 Jan. 31, 2008

(30) Foreign Application Priority Data

Jul. 28, 2006 (JP) .................................. 2006-206886

(51) Int. Cl.
*B05C 11/02* (2006.01)
(52) U.S. Cl. .......................................... 118/58; 134/153
(58) Field of Classification Search .................... 134/153
See application file for complete search history.

(56) References Cited

U.S. PATENT DOCUMENTS

| | | | |
|---|---|---|---|
| 6,752,543 B2 | 6/2004 | Fukutomi et al. | |
| 6,977,098 B2* | 12/2005 | Gurer et al. | 427/240 |
| 2002/0036066 A1* | 3/2002 | Ogawa et al. | 156/345 |
| 2005/0173068 A1* | 8/2005 | Chen et al. | 156/345.33 |

FOREIGN PATENT DOCUMENTS

| | | | |
|---|---|---|---|
| JP | 2000-24575 | | 1/2000 |
| JP | 2000024575 A | * | 1/2000 |
| JP | 2003-347186 | | 12/2003 |

OTHER PUBLICATIONS

Machine Translation of JP2000024575.*
Translation of JP 2000024575 A.*

* cited by examiner

*Primary Examiner* — Parviz Hassanzadeh
*Assistant Examiner* — Albert Hilton
(74) *Attorney, Agent, or Firm* — Ostrolenk Faber LLP

(57) ABSTRACT

A coating device includes a box-shaped processing chamber. Slits are respectively provided on four side surfaces of the processing chamber. A box-shaped housing is provided so as to surround the processing chamber. A space is formed between the processing chamber and the housing. A fan filter unit for forming downflow in the space is provided on the top of the housing. Air supplied to the fan filter unit is cleaned by the fan filter unit, and is supplied to the space. The air supplied to the space is supplied to the processing chamber through each of the slits in the processing chamber. This causes a twister-shaped air current to be generated within the processing chamber.

11 Claims, 6 Drawing Sheets

SUBSTRATE PROCESSING APPARATUS

BACKGROUND OF THE INVENTION

1. Field of the Invention

The present invention relates to a substrate processing apparatus for processing a substrate.

2. Description of the Background Art

In photolithographic processes in manufacturing processes of semiconductor devices, liquid crystal displays, and so on, resist films are first formed on substrates. The resist films formed on the substrates are exposed in predetermined patterns. The substrates that have been subjected to exposure processing, as described above, are then subjected to development processing, so that resist patterns are formed on the substrates.

Generally, widely used as methods of forming the resist films on the substrates has been spin coating.

A device for forming a film by the spin coating (hereinafter referred to as a coating device) mainly comprises a processing cup arranged so as to surround a substrate and a processing unit arranged so as to surround the processing cup (see JP 2000-24575 A, for example).

In such a coating device, clean air whose temperature and humidity are controlled is introduced by a fan or the like from above the processing unit, to control an atmosphere around the substrate, and is forcedly exhausted from the bottom thereof, to forcedly exhaust the atmosphere around the substrate.

In order to maintain a temperature and humidity suitable for processing in the coating device, a sufficient amount of air is supplied toward the substrate from above the substrate by an air control unit (ACU).

When the supplied air flows from the center of the substrate to a peripheral edge thereof and is exhausted from the bottom of the processing cup, however, turbulent flow is generated by friction between the flow of the air and an air current generated by the rotation of the substrate at the peripheral edge of the substrate.

As a result, particles adhering on an inner surface or the like of the processing cup and mists of a resist liquid floating in the processing cup are scattered by the generated turbulent flow. This may, in some cases, cause the scattered particles to adhere on the substrate. As a result, processing defects occur in the substrate.

SUMMARY OF THE INVENTION

An object of the present invention is to provide a substrate processing apparatus capable of preventing particles and mists from adhering on a substrate.

(1) According to an aspect of the present invention, a substrate processing apparatus for processing a substrate includes a substrate holding device that rotates the substrate while holding the substrate, a processing liquid supplier that supplies a processing liquid onto the substrate held by the substrate holding device, a gas sprayer having three or more spray ports that spray gas in a tangential direction of the substrate rotated by the substrate holding device or a direction parallel to the tangential direction, and a housing accommodating the substrate holding device, the processing liquid supplier, and the gas sprayer.

In the substrate processing apparatus, the substrate is rotated while being held by the substrate holding device. The processing liquid supplier supplies the processing liquid onto the substrate held by the substrate holding device.

The three or more spray ports of the gas sprayer spray the gas in the tangential direction of the substrate rotated by the substrate holding device or the direction parallel to the tangential direction. The substrate holding device, the processing liquid supplier, and the gas sprayer are accommodated within the housing.

When the substrate is thus subjected to the processing, the gas is sprayed in the tangential direction of the substrate rotated by the substrate holding device or the direction parallel to the tangential direction, which allows a twister-shaped air current to be generated above the substrate within the housing. This allows turbulent flow generated by friction between an atmosphere around the substrate and an air current generated by the rotation of the substrate to be absorbed by the twister-shaped air current. This causes the turbulent flow to be removed.

Such a configuration prevents particles adhering on various types of members provided in the housing and mists floating in the housing from being scattered by the turbulent flow. Consequently, the particles can be prevented from adhering on the substrate.

It has been conventionally difficult to rotate the substrate at high speed in consideration of the effect of the turbulent flow. Even when the substrate is rotated at high speed by using the substrate processing apparatus according to the present invention, however, it is possible to remove the turbulent flow by generating the twister-shaped air current.

Consequently, it is possible to shorten a time period required for coating of processing liquid by rotating the substrate at high speed as well as to increase the allowable range of the speed of rotation of the substrate that aims at adjusting the thickness of a film to be formed.

The processing liquid may be a coating liquid. In this case, when a coating film is formed on the substrate, a ripple (wind ripple) is prevented from being produced at a peripheral edge of the coating film on the substrate by the effect of the turbulent flow, and the thickness at the peripheral edge of the coating film is prevented from being increased. This causes a coating film having a uniform thickness to be formed on the substrate.

The processing liquid may be a development liquid, a rinse liquid, or a washing liquid. In this case, even when the substrate is subjected to development processing, rinsing processing after the development processing, or washing processing, the gas is sprayed in the tangential direction of the substrate rotated by the substrate holding device or the direction parallel to the tangential direction, which allows a twister-shaped air current to be generated above the substrate within the housing. This allows turbulent flow generated by friction between an atmosphere around the substrate and an air current generated by the rotation of the substrate to be absorbed by the twister-shaped air current. This causes the turbulent flow to be removed.

Such a configuration prevents particles adhering on various types of members provided in the housing and mists floating in the housing from being scattered by the turbulent flow. Consequently, the particles can be prevented from adhering on the substrate, so that the development processing, the rinsing processing, or the washing processing is satisfactorily performed.

(2) The substrate processing apparatus may further include a splash guard provided so as to surround the substrate holding device and having an upper opening for preventing the processing liquid supplied onto the substrate from being splashed outward, and the spray ports of the gas sprayer may be arranged such that a spiral air current is generated above the upper opening of the splash guard.

In this case, the splash guard for preventing the processing liquid supplied onto the substrate from being splashed outward is provided so as to surround the substrate holding device. The spray ports of the gas sprayer are arranged such that a twister-shaped air current is generated above the upper opening of the splash guard. This allows turbulent flow generated by friction between an atmosphere above the substrate and an air current generated by the rotation of the substrate to be absorbed by the twister-shaped air current. This causes the turbulent flow to be removed.

Such a configuration prevents particles adhering on an inner wall or the like of the splash guard and mists floating in a space surrounded by the splash guard from being scattered by the turbulent flow. Consequently, the particles can be prevented from adhering on the substrate.

(3) The gas sprayer may include a gas supply system that supplies gas to the housing, and an air current formation chamber provided so as to surround a space above the upper opening of the splash guard, and the air current formation chamber may have the three or more spray ports.

In this case, the gas supply system supplies the gas to the housing. Further, the gas formation chamber is provided so as to surround the space above the upper opening of the splash guard. The gas formation chamber has the three or more spray ports. This causes the gas supplied to the housing to be introduced into a space above the substrate from the three or more spray ports of the gas formation chamber. Such a configuration allows a good twister-shaped air current to be generated above the substrate.

(4) The gas spray system may include a gas control device that controls the temperature and the humidity of the gas and a gas cleaning device that cleans the gas whose temperature and humidity are controlled by the gas control device.

In this case, the gas cleaning device cleans the gas whose temperature and humidity are controlled by the gas control device. This causes the gas having a desired temperature and humidity conforming to the type of processing of the substrate and cleaned to be supplied to the housing and the gas formation chamber.

(5) The gas sprayer may include three or more sprayers arranged around a space above the upper opening of the splash guard, and each of the three or more sprayers may have the spray ports.

In this case, the three or more sprayers are arranged around the space above the upper opening of the splash guard. Each of the three or more sprayers has the spray ports. This causes the gas to be supplied to a space above the substrate from each of the spray ports of each of the three or more sprayers. Such a configuration allows a good twister-shaped air current to be generated above the substrate.

(6) Each of the spray ports may be formed in a slit shape extending in the vertical direction. Each of the spray ports is thus formed in the slit shape extending in the vertical direction, which allows a swirling force of the gas sprayed from each of the spray ports to be increased and allows a good twister-shaped air current to be generated.

(7) Each of the spray ports may include a plurality of holes arranged in the vertical direction. In this case, the gas is sprayed from the plurality of holes arranged in the vertical direction. A spray port similar to the above-mentioned splay port in the slit shape extending in the vertical direction can be formed by arranging the plurality of holes in the vertical direction. Such a configuration allows a good twister-shaped air current whose swirling force is increased to be generated.

(8) The three or more spray ports may be spaced at equal angles around the rotation center of the substrate rotated by the substrate holding device.

Such a configuration allows a reliable twister-shaped air current whose swirling force is further increased to be generated.

(9) The substrate processing apparatus may further include an exhaust system that exhausts the gas out of the housing from below the substrate holding device.

In this case, even when the particles adhering on various types of members provided in the housing and the mists floating in the housing are scattered by the turbulent flow, the particles and the mists can be absorbed by the twister-shaped air current. The twister-shaped air current that has absorbed the particles and the mists can be discharged out of the housing by the exhaust system. This eliminates the necessity of a device for removing the particles and the mists.

The substrate processing apparatus according to the present invention can prevent the particles and the mists from adhering on the substrate.

Other features, elements, characteristics, and advantages of the present invention will become more apparent from the following description of preferred embodiments of the present invention with reference to the attached drawings.

DESCRIPTION OF THE PREFERRED EMBODIMENTS

Figure 1:
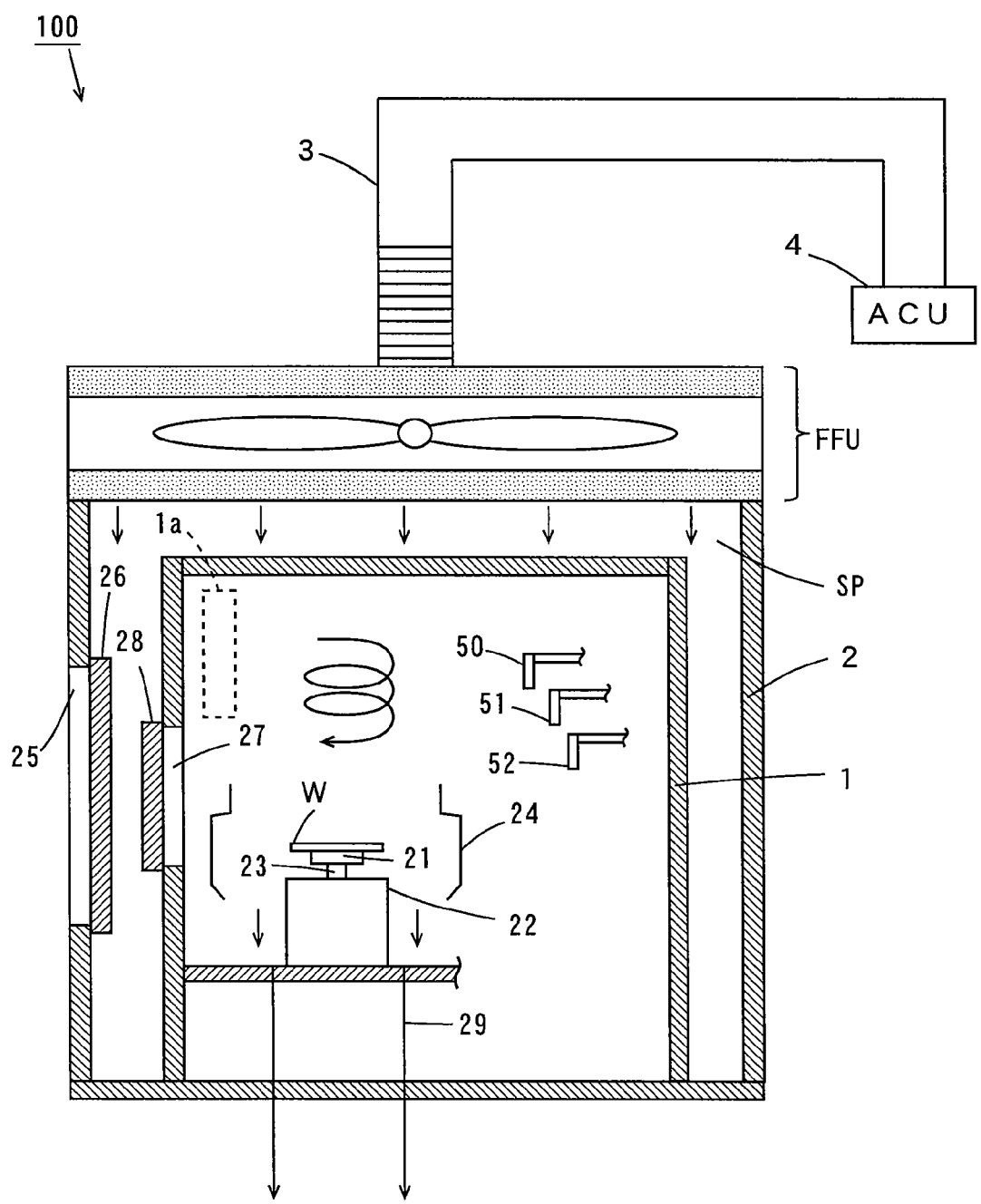
FIG. 1 is a cross-sectional view showing the overall configuration of a coating device according to a first embodiment.

A coating device will be described as an example of a substrate processing apparatus according to the present invention while referring to the drawings.

In the following description, a substrate refers to a semiconductor wafer, a glass substrate for a liquid crystal display, a glass substrate for a PDP (Plasma Display Panel), a glass substrate for a photo-mask, a glass substrate for an optical disc, or the like.

(1) First Embodiment (1-1) Overall Configuration of Coating Device

First, the configuration of a coating device according to a first embodiment will be described while referring to the drawings.

FIG. 1 is a cross-sectional view showing the overall configuration of the coating device according to the first embodiment.

As shown in FIG. 1, a coating device 100 comprises a box-shaped processing chamber 1. A slit 1a having a length of 260 mm and a width of 4 mm, for example, is provided on each of four side surfaces of the processing chamber 1. In FIG. 1, the other three slits 1a are not illustrated because of a cross-sectional view.

A box-shaped housing 2 is provided so as to surround the processing chamber 1. A space SP is formed between the processing chamber 1 and the housing 2.

A fan filter unit FFU for forming downflow in the space SP is provided on the top of the housing 2. The fan filter unit FFU is composed of a fan and a filter.

A duct 3 has its one end connected to the fan filter unit FFU and the other end connected to an air control unit (ACU) 4. Such a configuration causes air that is controlled to a predetermined temperature and humidity in the air control unit 4 to be supplied to the fan filter unit FFU through the duct 3. The air supplied to the fan filter unit FFU is cleaned by the fan filter unit FFU, and is supplied to the space SP.

The air supplied to the space SP is supplied to the processing chamber 1 through each of the slits 1a in the processing chamber 1. The function and the effect of the air supplied to the processing chamber 1 will be described later.

A suction-type spin chuck 21 for horizontally holding a substrate W serving as a processing object as well as rotating the substrate W about a vertical rotation axis passing through the center of the substrate W is provided within the processing chamber 1.

The spin chuck 21 is fixed to an upper end of a rotating shaft 23 rotated by a chuck rotation driving mechanism 22. The spin chuck 21 is accommodated in a processing cup 24 whose top and bottom are opened.

Although in the present embodiment, the suction-type spin chuck 21 is used, an edge holding-type spin chuck for holding a peripheral edge of the substrate W may be used.

Furthermore, resist liquid supply nozzles 50, 51, and 52 for supplying various types of resist liquids onto the substrate W are provided within the processing chamber 1.

In the present embodiment, any one of the resist liquid supply nozzles 50, 51, and 52 supplies the resist liquid onto the substrate W rotated by the spin chuck 21 (hereinafter referred to as coating processing). This causes a resist film to be formed on the substrate W.

An opening 25 is formed in a substantially central part of one side surface of the housing 2. A carry-in/carry-out shutter 26 is attached to the opening 25. The carry-in/carry-out shutter 26 is driven by a driver (not shown), to open or close the opening 25.

Similarly, an opening 27 is formed at a position corresponding to the opening 25 in a substantially central part of one side surface of the processing chamber 1. A carry-in/carry-out shutter 28 is attached to the opening 27. The carry-in/carry-out shutter 28 is driven by a driver (not shown), to open or close the opening 27.

In such a configuration, the openings 25 and 27 are brought into an opened state by the carry-in/carry-out shutters 26 and 28, so that the substrate W is carried into and out of the processing chamber 1.

Here, in the case of resist liquid coating processing, the air from the fan filter unit FFU is supplied to the processing chamber 1 from each of the slits 1a (four slits in the present embodiment) in the processing chamber 1 through the space SP, as described above. This allows a twister-shaped air current swirling in the same direction as the rotation direction of the substrate W to be generated above the substrate W. Here, the twister-shaped air current means an air current swirling in a spiral shape.

The twister-shaped air current thus generated advances downward through the processing cup 24 from above the substrate W, and is discharged out of the housing 2 through an exhaust pipe 29 provided in a lower part of the processing chamber 1.

(1-2) Position of Each Slit in Processing Chamber

The position of each of the slits 1a in the processing chamber 1 will be described while referring to the drawings.

Figure 2:
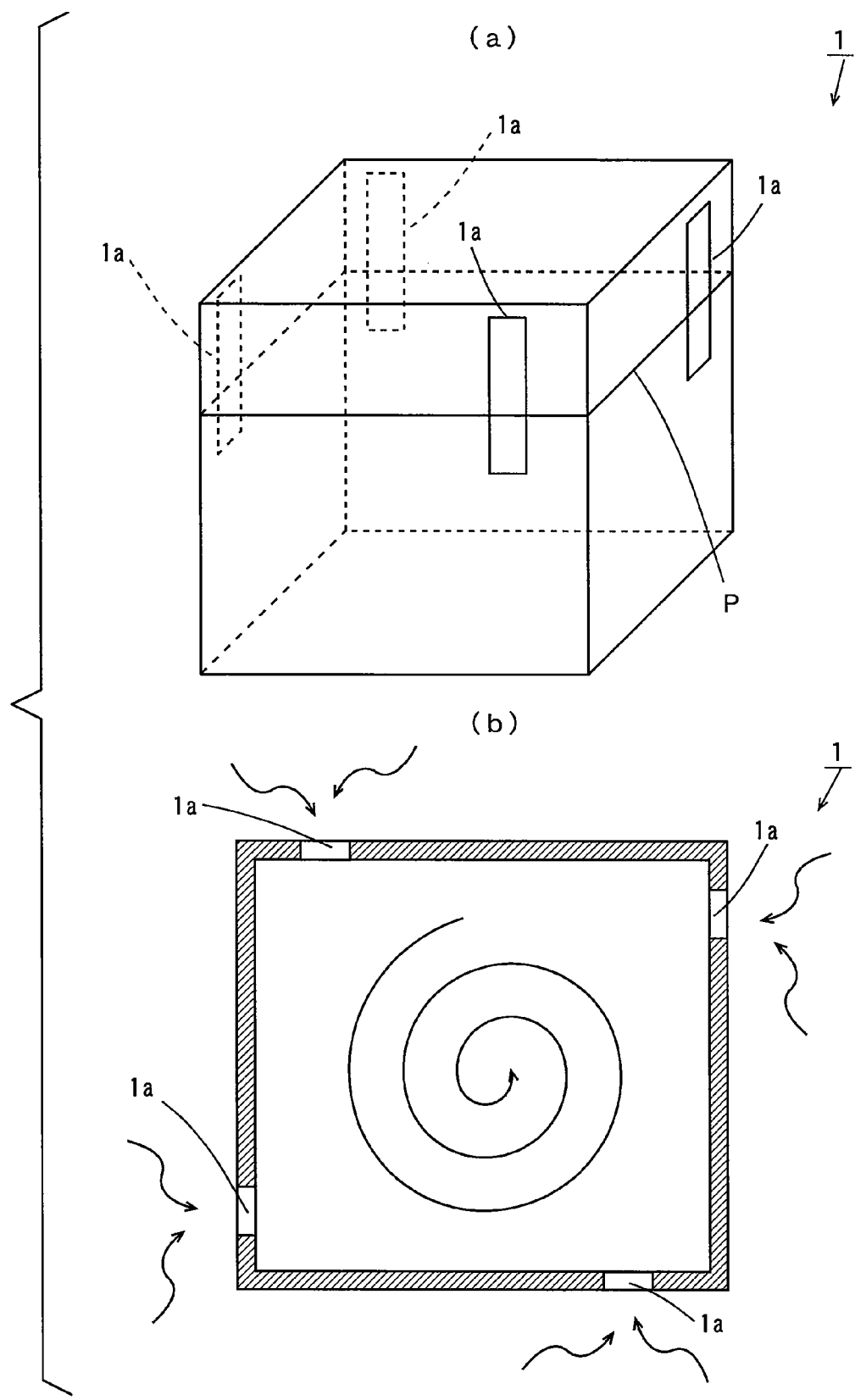
FIG. 2 is an explanatory view showing the position of each slit in a processing chamber.

FIG. 2 is an explanatory view showing the position of each of the slits 1a in the processing chamber 1. FIG. 2 (*a*) is a perspective view showing the position of each of the slits 1a in the processing chamber 1, and FIG. 2 (*b*) is a cross-sectional view taken along a P surface in FIG. 2 (*a*).

As shown in FIG. 2 (*a*), the slits 1a are respectively provided at predetermined positions on the four side surfaces of the processing chamber 1. The predetermined position of each of the slits 1a will be described later.

As shown in FIG. 2 (*b*), the slits 1a are respectively provided on the four side surfaces of the processing chamber 1, which causes the air introduced into the processing chamber 1 from each of the slits 1 to form a twister-shaped air current.

Figure 3:
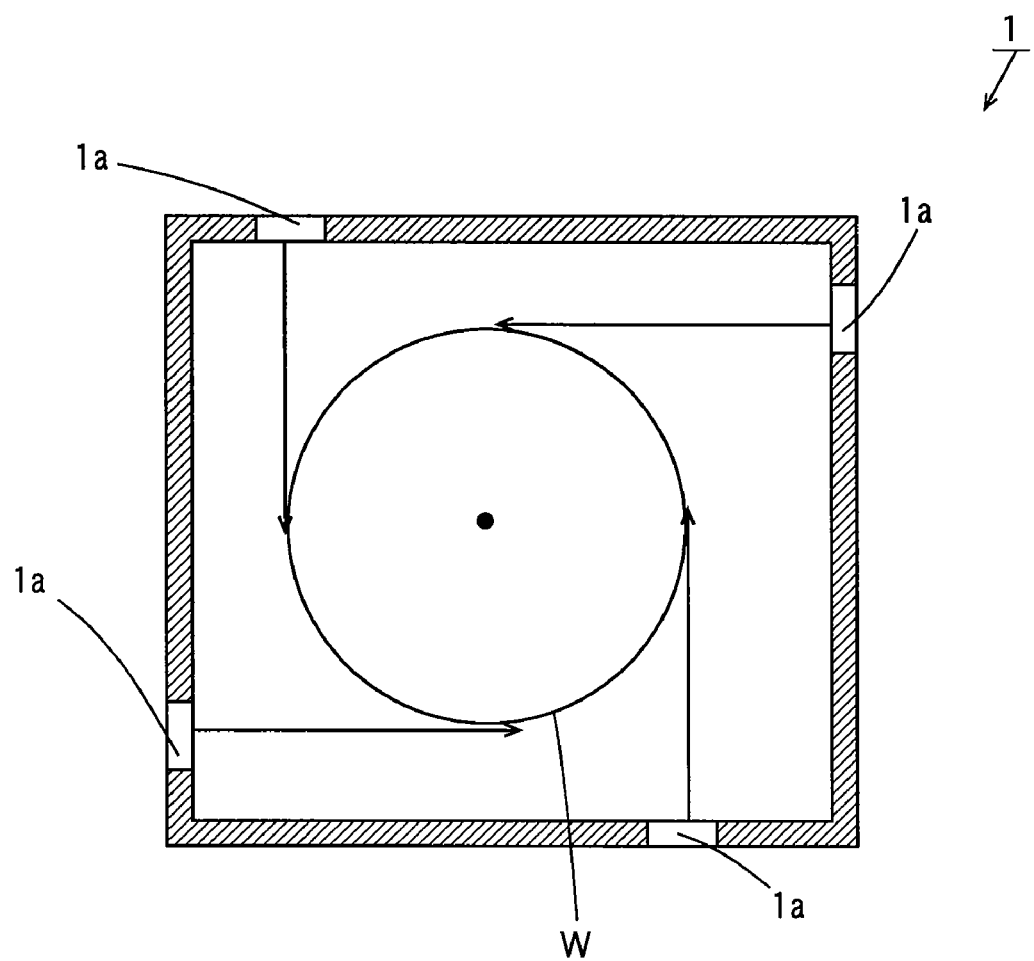
FIG. 3 is an explanatory view showing a preferred example of the position of each slit in a processing chamber.

FIG. 3 is an explanatory view showing a preferred example of the position of each of the slits 1a in the processing chamber 1.

As shown in FIG. 3, the slits 1a are respectively provided in the following manner on the four side surfaces of the processing chamber 1. That is, each of the slits 1a is provided at a position where an extension of a tangent to the substrate W vertically crosses an inner wall of the processing chamber 1. Such a configuration allows a good twister-shaped air current swirling in the same direction as the rotation direction of the substrate W to be generated within the processing chamber 1.

(1-3) Effect of First Embodiment

The following effect is produced by thus using a double configuration in which the processing chamber 1 is arranged within the housing 2 as well as using the coating device 100 in which the processing chamber 1 is provided with the four slits 1a.

When the resist liquid coating processing is performed in the coating device 100, the twister-shaped air current is generated within the processing chamber 1, which allows turbulent flow generated by friction between air supplied from the fan filter unit FFU and an air current generated by the rotation of the substrate W to be absorbed by the twister-shaped air current. This causes the turbulent flow to be removed.

This prevents particles adhering on an inner surface or the like of the processing cup 24 and mists floating in the processing cup 24 from being scattered by the turbulent flow. Consequently, the particles can be prevented from adhering on the substrate W.

The above-mentioned configuration prevents a ripple (wind ripple) from being produced at the peripheral edge of the resist film on the substrate W by the effect of the turbulent flow and prevents the thickness at the peripheral edge of the resist film from being increased. This causes a resist film having a uniform thickness to be formed on the substrate W.

It has been conventionally difficult to rotate the substrate W at high speed in consideration of the effect of the turbulent flow. Even when the substrate W is rotated at high speed by using the coating device 100 according to the present embodiment, however, it is possible to remove the turbulent flow by generating the twister-shaped air current.

Consequently, it is possible to shorten a time period required for the coating processing by rotating the substrate W at high speed as well as to increase the allowable range of the speed of rotation of the substrate W that aims at adjusting the thickness of a resist film to be formed.

(2) Second Embodiment

(2-1) Overall Configuration of Coating Device

The configuration of a coating device according to a second embodiment will be then described while referring to the drawings.

Figure 4:
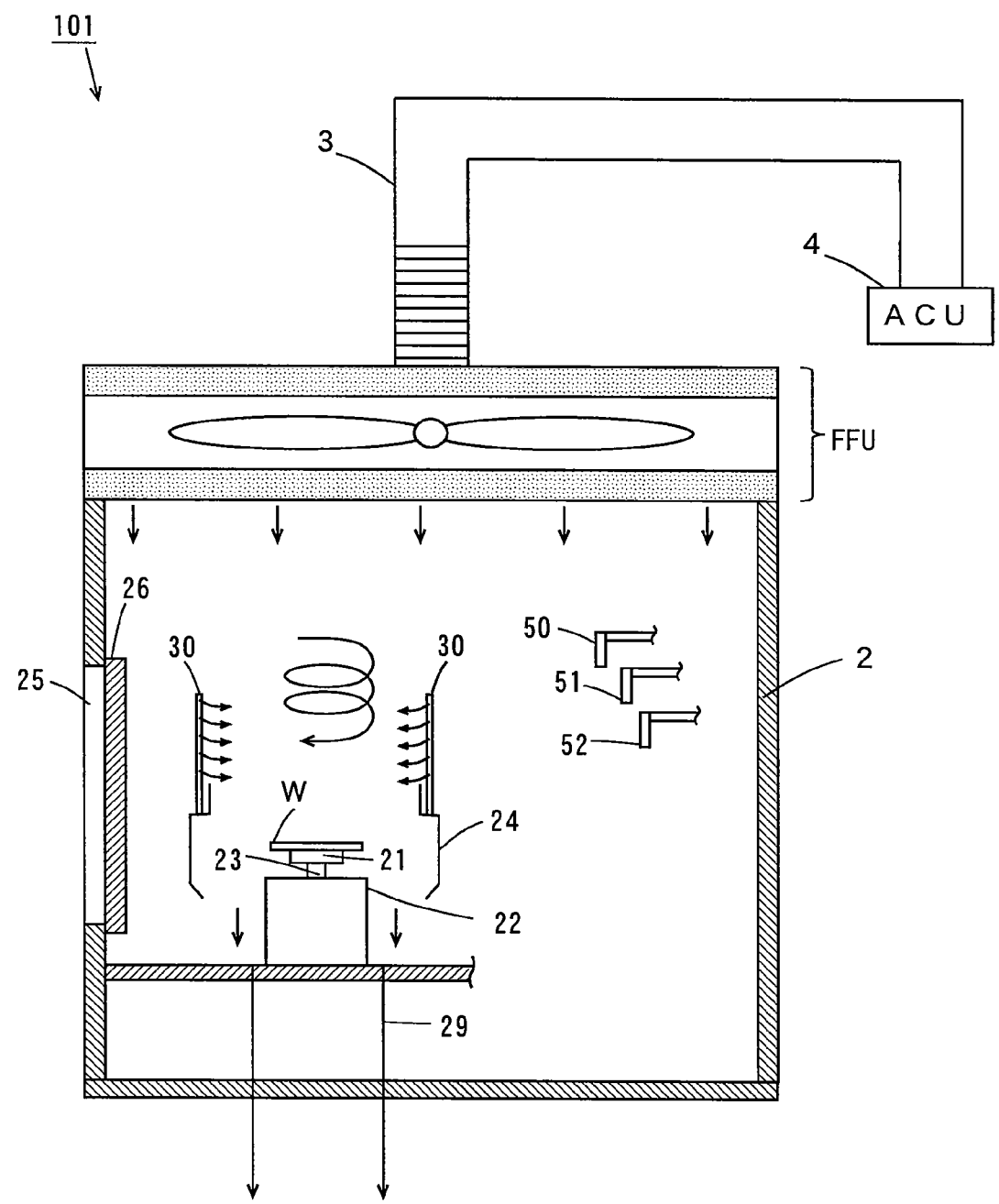
FIG. 4 is a cross-sectional view showing the overall configuration of a coating device according to a second embodiment.

FIG. 4 is a cross-sectional view showing the overall configuration of the coating device according to the second embodiment.

As shown in FIG. 4, the configuration of a coating device 101 according to the second embodiment differs from the configuration of the coating device 100 according to the first embodiment in the following points.

In the coating device 101, a processing chamber 1 is not provided in a housing 2. That is, the coating device 101 according to the present embodiment has neither a double configuration nor a slit 1a.

Furthermore, a plurality of (four (described later) in the present embodiment) air spray bars 30 are provided on a processing cup 24.

(2-2) Configuration of Air Spray Bar

Description is now made of the configuration of the plurality of air spray bars 30 provided on the processing cup 24 and the arrangement thereof.

Figure 5:
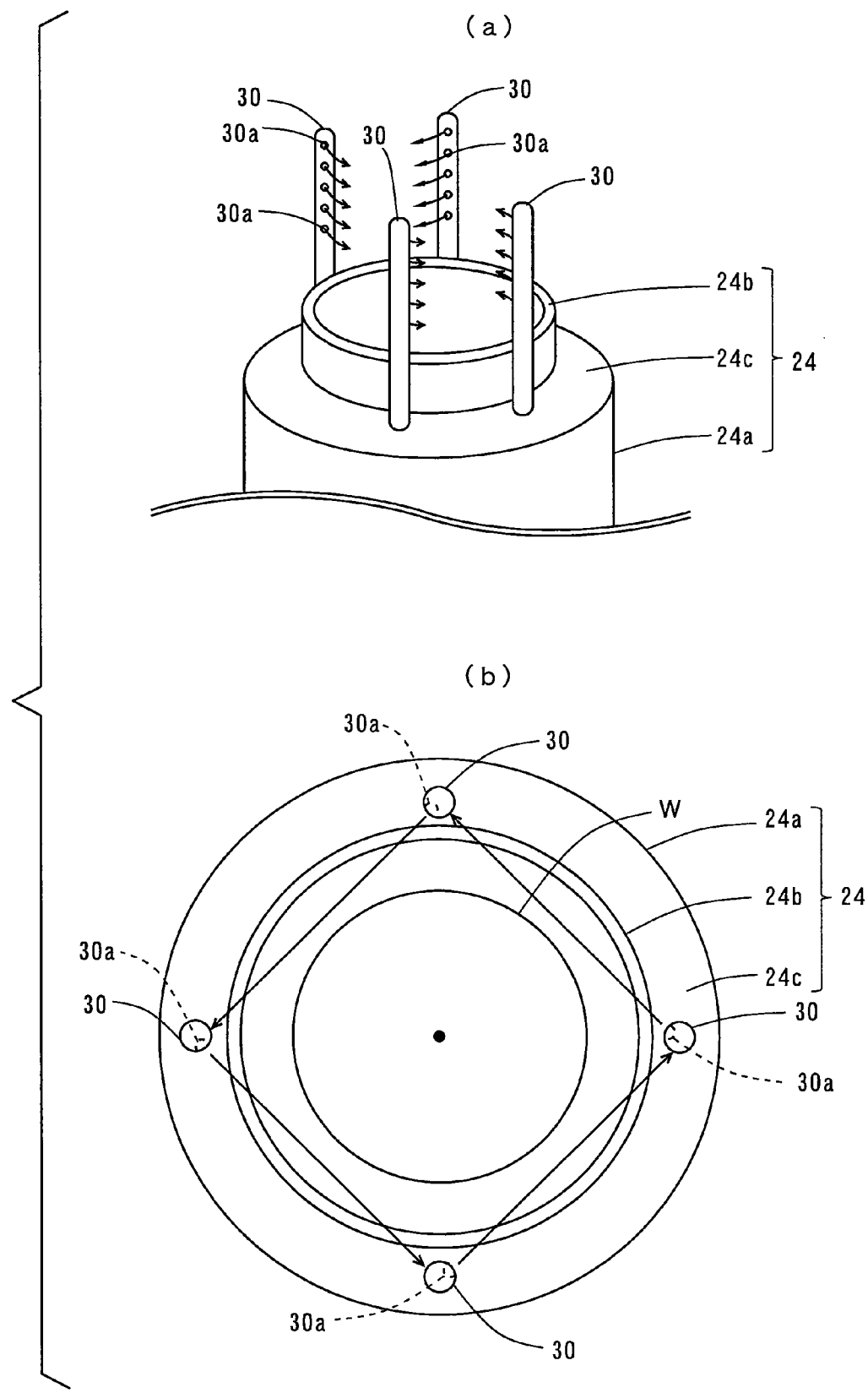
FIG. 5 is a schematic view showing the configuration of an air spray bar and the arrangement thereof.

FIG. 5 is a schematic view showing the configuration of the air spray bars 30 and the arrangement thereof. FIG. 5 (a) is a perspective view showing the air spray bars 30, and FIG. 5 (b) is a top view of FIG. 5 (a).

As shown in FIG. 5 (a), the processing cup 24 comprises a main body 24a which is circular in cross section and an opening 24b, which is circular in cross section, provided on the main body 24a. The diameter of the main body 24a is larger than the diameter of the opening 24b. Consequently, an annular upper surface portion 24c is formed on the main body 24a.

The four air spray bars 30 are provided in an upright state on the upper surface portion 24c. Each of the air spray bars 30 has a plurality of spray holes 30a provided so as to be almost equally spaced along the length of the air spray bar 30.

Here, as shown in FIG. 5 (b), it is preferable that the air spray bars 30 are spaced at approximately 90 degrees around the rotation center of the substrate W on the upper surface portion 24c in the processing cup 24.

The spray holes 30a in each of the air spray bars 30 are opened in a direction parallel to a tangent to the substrate W. Further, each of the spray holes 30a in each of the air spray bars 30 is connected to an air supply source (not shown). This allows air to be sprayed in a direction parallel to the tangent to the substrate W by each of the air spray bars 30. For example, the amount of air sprayed by the four air spray bars 30 is equal to or more than the amount of air exhausted from below the processing cup 24.

Such a configuration allows a good twister-shaped air current swirling in the same direction as the rotation direction of the substrate W to be generated above the substrate W.

(2-3) Effect of Second Embodiment

The following effect is produced by thus using the coating device 10 in which the four air spray bars 30 are provided on the processing cup 24.

First, when the substrate W is subjected to resist liquid coating processing in the coating device 101, a twister-shaped air current is generated above the processing cup 24, which allows turbulent flow generated by friction between air supplied from a fan filter unit FFU and an air current generated by the rotation of the substrate W to be absorbed by the twister-shaped air current. This causes the turbulent flow to be removed.

This prevents particles adhering on an inner surface or the like of the processing cup 24 from being scattered by the turbulent flow. Consequently, the particles can be prevented from adhering on the substrate W.

The above-mentioned configuration prevents a ripple (wind ripple) from being produced at a peripheral edge of a resist film on the substrate W by the effect of the turbulent flow and prevents the thickness of the resist film from being increased. This causes a resist film having a uniform thickness to be formed on the substrate W.

Furthermore, it has been conventionally difficult to rotate the substrate W at high speed in consideration of the effect of the turbulent flow. Even when the substrate W is rotated at high speed by using the coating device 101 according to the present embodiment, however, it is possible to remove the turbulent flow by generating the twister-shaped air current.

Consequently, it is possible to shorten a time period required for the coating processing by rotating the substrate W at high speed as well as to increase the allowable range of the speed of rotation of the substrate W that aims at adjusting the thickness of a resist film to be formed.

(3) Another Embodiment

Figure 6:
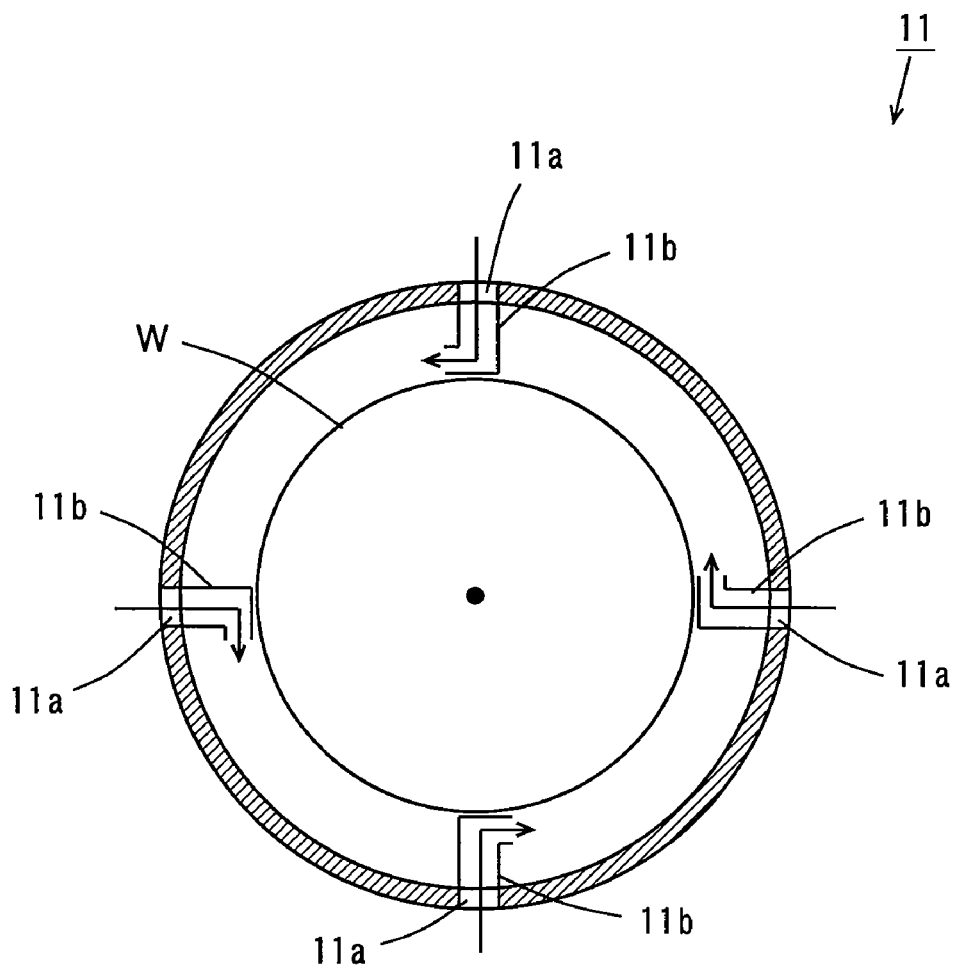
FIG. 6 is a cross-sectional view showing another example of a processing chamber in the coating device according to the first embodiment.

FIG. 6 is a cross-sectional view showing another example of the processing chamber 1 in the coating device 100 according to the first embodiment.

The box-shaped processing chamber 1 in the first embodiment may be replaced with a cylindrical processing chamber 11, as shown in FIG. 6.

Four slits 11a are spaced at approximately 90 degrees around the rotation center of a substrate W on a side surface of the processing chamber 11 in the present embodiment. A supply pipe 11b is connected to each of the slits 11a so as to be directed inward from an inner peripheral surface of the processing chamber 11.

A front end of each of the supply pipes 11b is curved in the same direction as the direction of a tangent to the substrate W, and is opened in such a direction that air is supplied in a predetermined direction (a clockwise direction or a counter-clockwise direction).

Although in FIG. 6, the four slits 11a and the corresponding four supply pipes 11b are respectively spaced at approximately 90 degrees on the side surface of the processing chamber 11, the present invention is not limited to the same. Three slits 11a and corresponding three supply pipes 11b may be respectively spaced at 120 degrees, for example, on the side surface of the processing chamber 11. Alternatively, five or more slits 11a and supply pipes 11b may be respectively provided.

Such a configuration allows a good twister-shaped air current swirling in the same direction as the rotation direction of the substrate W to be generated above the substrate W.

Although in the second embodiment, the four air spray bars 30 are spaced at approximately 90 degrees on the upper surface portion 24c in the processing cup 24, the present invention is not limited to the same. Three air spray bars 30 may be spaced at 120 degrees, for example, on the upper surface portion 24c. Alternatively, five or more air spray bars 30 may be provided.

Although in the first and second embodiments, description was made of a case where the resist film is formed on the substrate W as the coating processing, the present invention is not limited to the same. For example, it is possible to use the coating devices 100 and 101 even when another film such as an anti-reflection film is formed.

Although in the first and second embodiments, the air is supplied by the fan filter unit FFU, the present invention is not limited to the same. For example, inert gas such as nitrogen gas may be supplied.

A plurality of holes arranged in the vertical direction may be provided in place of each of the slits 1a in the first embodiment.

Furthermore, a slit extending in the vertical direction may be provided in place of the plurality of spray holes 30a in each of the air spray bars 30 in the second embodiment.

(4) Examples of Application to Another Substrate Processing Apparatus

The present invention is not limited to the coating device. For example, it is applicable to various types of substrate processing apparatuses, as described below.

(4-1) Developing Device

In a developing device, a development liquid supply nozzle and a rinse liquid supply nozzle are provided in place of the resist liquid supply nozzles 50, 51, and 52 shown in FIG. 1 or 4.

In the developing device, the development liquid supply nozzle supplies a development liquid onto a rotated substrate W (hereinafter referred to as developing processing). Thereafter, the substrate W is held for a predetermined time period in a standstill state. Thus, a resist film on the substrate W after exposure is subjected to the development processing by another process.

The rinse liquid supply nozzle supplies a rinse liquid onto the rotated substrate W, so that the progress of the development is stopped. Finally, the substrate W is dried by being rotated at high speed.

In the developing device, a twister-shaped air current is also generated within the processing chamber 1 when the substrate W is subjected to the development processing or the rinsing processing, which allows turbulent flow generated by friction between air supplied from a fan filter unit FFU and an air current generated by the rotation of the substrate W to be removed by the twister-shaped air current.

This prevents particles adhering on an inner surface or the like of a processing cup 24 and mists floating in the processing cup 24 from being scattered by the turbulent flow. This prevents the particles and the mists from adhering on the substrate W. Consequently, it is possible to satisfactorily subject the substrate W to the development processing and the rinsing processing.

(4-2) Washing Device

In a washing device, a washing liquid supply nozzle and a rinse liquid supply nozzle are provided in place of the resist liquid supply nozzles 50, 51, and 52 shown in FIG. 1 or 4.

In the washing device, the washing liquid supply nozzle supplies a washing liquid onto a rotated substrate W (hereinafter referred to as washing processing). Thus, the substrate W is subjected to the washing processing.

Thereafter, the rinse liquid supply nozzle supplies a rinse liquid onto the rotated substrate W, so that the washing liquid is washed away. Finally, the substrate W is dried by being rotated at high speed.

In the washing device, a twister-shaped air current is also generated within the processing chamber 1 when the substrate W is subjected to the washing processing, which allows turbulent flow generated by friction between air supplied from a fan filter unit FFU and an air current generated by the rotation of the substrate W to be removed by the twister-shaped air current.

This prevents particles adhering on an inner surface or the like of a processing cup 24 and mists floating in the processing cup 24 from being scattered by the turbulent flow. This prevents the particles and the mists from adhering on the substrate W. Consequently, it is possible to satisfactorily subject the substrate W to the washing processing.

(5) Correspondences between Elements in Claims and Units in Embodiments

In the following paragraphs, non-limiting examples of correspondences between various elements recited in the claims below and those described above with respect to various preferred embodiments of the present invention are explained.

In the embodiments described above, the spin chuck 21 is an example of a substrate holding device, the resist liquid supply nozzles 50, 51, and 52 are examples of a processing liquid supplier, the slits 11a and 11b and the air spray bar 30 are examples of an air sprayer, the housing 2 is an example of a housing, the processing cup 24 is an example of a splash guard, the slits 11a and 11a and the spray hole 30a are examples of a spray port, the fan filter unit FFU, the duct 3, and the air control unit 4 are examples of a gas supply system, the processing chambers l and 11 are examples of an air current formation chamber, the air control unit 4 is an example of a gas control device, the fan filter unit FFU is an example of a gas cleaning device, the air spray bar 30 is an example of a sprayer, and the exhaust pipe 29 is an example of an exhaust system.

As each of constituent elements in the claims, various other elements having the configuration or the function described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A substrate processing apparatus for processing a substrate, comprising:
   a housing accommodating a substrate holding device that rotates the substrate about an axis of rotation while holding the substrate;
   a processing liquid supplier that supplies a processing liquid onto the substrate held by said substrate holding device;
   a splash guard disposed surrounding said substrate holding device and having an upper opening and a lower opening for preventing the processing liquid supplied onto the substrate from being splashed outward;
   a gas supply system that supplies gas to said housing; and
   an air current formation chamber having three or more spray ports formed in a sidewall thereof and arranged above said upper opening of said splash guard and disposed radially outwardly from said upper opening and said axis of rotation, and arranged for spraying said gas in a tangential direction of the substrate rotated by said substrate holding device or a direction parallel to the tangential direction and thereby generating a spiral air current above said upper opening of said splash guard.

2. The substrate processing apparatus according to claim 1, wherein said gas sprayer includes
   a gas control device that controls the temperature and the humidity of the gas, and
   a gas cleaning device that cleans the gas whose temperature and humidity are controlled by said gas control device.

3. The substrate processing apparatus according to claim 1, wherein each of said spray ports is formed in a slit shape extending in the vertical direction.

4. The substrate processing apparatus according to claim 1, wherein each of said spray ports includes a plurality of holes arranged in the vertical direction.

5. The substrate processing apparatus according to claim 1, wherein said three or more spray ports are spaced at equal angles around the rotation center of the substrate rotated by said substrate holding device.

6. The substrate processing apparatus according to claim 1, further comprising
   an exhaust system that exhausts the gas out of the housing from said lower opening of said splash guard.

7. A substrate processing apparatus for processing a substrate, comprising:
   a substrate holding device that rotates the substrate while holding the substrate;
   a processing liquid supplier that supplies a processing liquid onto the substrate held by said substrate holding device;
   a splash guard disposed surrounding said substrate holding device and having an upper opening and a lower opening, for preventing the processing liquid supplied onto the substrate from being splashed outward;
   a gas sprayer arranged above said upper opening of said splash guard and disposed outwardly with respect to said upper opening and arranged for spraying gas in a tangential direction of the substrate rotated by said substrate holding device or a direction parallel to the tangential direction and thereby generating a spiral air current above said upper opening of said splash guard; and
   a housing accommodating said substrate holding device, said processing liquid supplier, and the gas sprayer, wherein
   said gas sprayer includes
   three or more sprayers arranged around a space above said upper opening of said splash guard,
   each of said three or more sprayers having a spray port.

8. The substrate processing apparatus according to claim 7, wherein each of said spray ports is formed in a slit shape extending in the vertical direction.

9. The substrate processing apparatus according to claim 7, wherein each of said spray ports includes a plurality of holes arranged in the vertical direction.

10. The substrate processing apparatus according to claim 7, wherein said spray ports are spaced at equal angles around the rotation center of the substrate rotated by said substrate holding device.

11. The substrate processing apparatus according to claim 7, further comprising
    an exhaust system that exhausts the gas out of the housing from said lower opening of said splash guard.

* * * * *